(12) United States Patent
Ogawa

(10) Patent No.: US 10,014,226 B2
(45) Date of Patent: Jul. 3, 2018

(54) METHOD OF MANUFACTURING SEMICONDUCTOR DEVICE

(71) Applicant: HITACHI KOKUSAI ELECTRIC INC., Tokyo (JP)

(72) Inventor: Arito Ogawa, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 15/465,891

(22) Filed: Mar. 22, 2017

(65) Prior Publication Data

US 2017/0287786 A1 Oct. 5, 2017

(30) Foreign Application Priority Data

Mar. 30, 2016 (JP) ................. 2016-068137

(51) Int. Cl.
*H01L 21/28* (2006.01)
*H01L 21/8238* (2006.01)
*H01L 21/3215* (2006.01)
*H01L 27/092* (2006.01)
*H01L 21/8234* (2006.01)
*H01L 21/3205* (2006.01)

(52) U.S. Cl.
CPC ........... *H01L 21/823842* (2013.01); *H01L 21/28079* (2013.01); *H01L 21/28088* (2013.01); *H01L 21/3215* (2013.01); *H01L 21/32051* (2013.01); *H01L 21/82345* (2013.01); *H01L 27/0922* (2013.01)

(58) Field of Classification Search
CPC ....... H01L 21/823842; H01L 21/82345; H01L 21/3215; H01L 21/28088; H01L 21/28079; H01L 21/32051; H01L 27/0922
See application file for complete search history.

(56) References Cited

U.S. PATENT DOCUMENTS

| | | | | |
|---|---|---|---|---|
| 6,027,961 | A | * 2/2000 | Maiti | H01L 21/823842 257/E21.637 |
| 2006/0115940 | A1 | * 6/2006 | Kim | H01L 21/28088 438/197 |
| 2008/0157228 | A1 | * 7/2008 | Chambers | H01L 21/28079 257/407 |
| 2010/0297846 | A1 | 11/2010 | Kaga et al. | |
| 2016/0196980 | A1 | 7/2016 | Degai et al. | |

FOREIGN PATENT DOCUMENTS

| JP | 2011-006783 A | 1/2011 |
|---|---|---|
| JP | 2014-195066 | 10/2014 |
| JP | 2016-125104 A | 7/2016 |

* cited by examiner

*Primary Examiner* — Michael Trinh
(74) *Attorney, Agent, or Firm* — Volpe and Koenig, P.C.

(57) ABSTRACT

A process of forming a first mask on a first region of a metal film formed on a surface of a substrate, a process of modulating a work function of a first exposed region of the metal film, using plasma of a first process gas, a process of removing the first mask, a process of forming a second mask on a second region of the metal film, and a process of modulating the work function of a second exposed region of the metal film, using plasma of a second process gas are executed.

8 Claims, 7 Drawing Sheets

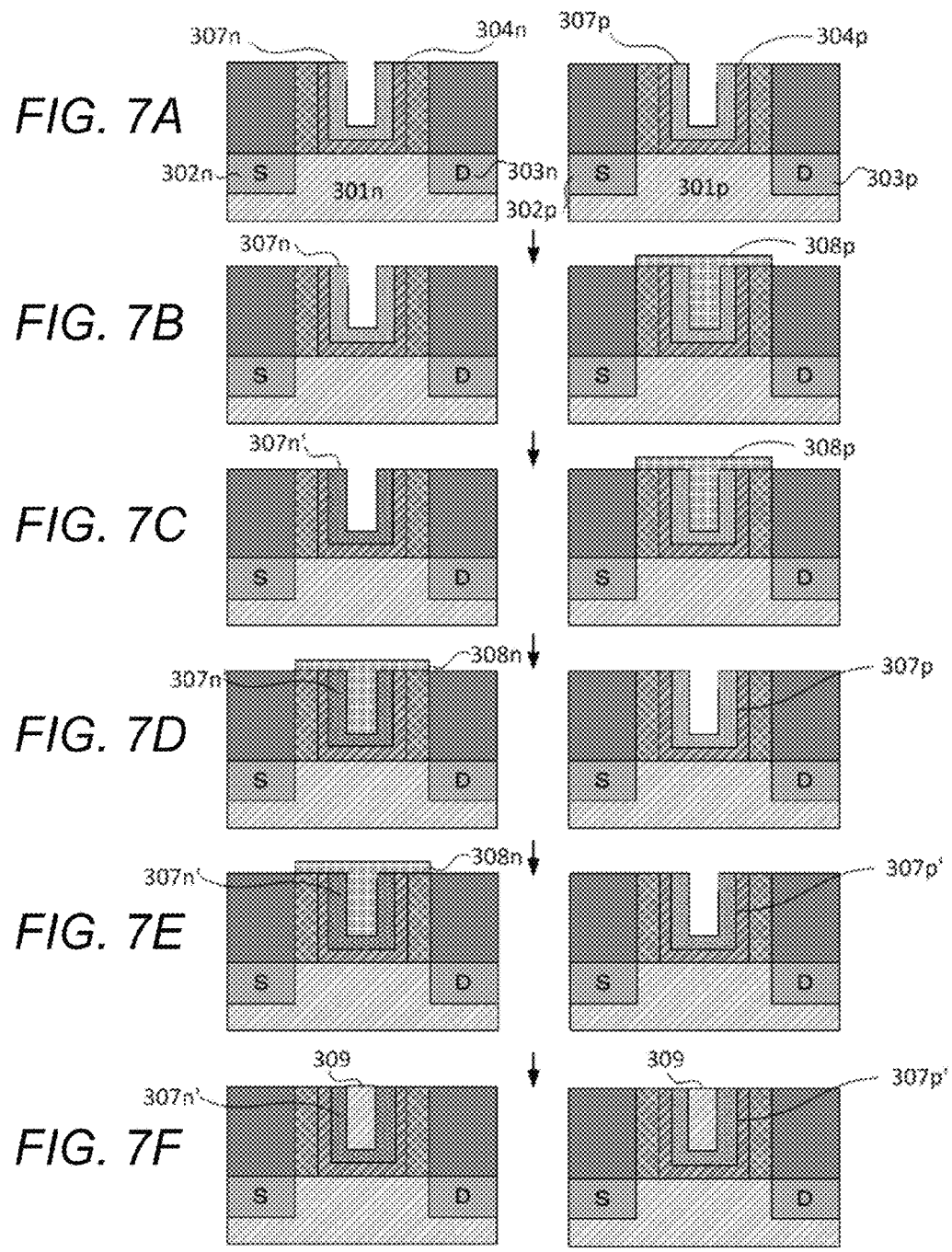

METHOD OF MANUFACTURING SEMICONDUCTOR DEVICE

BACKGROUND

Technical Field

The present invention relates to a method of manufacturing a semiconductor device.

Related Art

Recent semiconductor devices have been increasingly refined, and thinner films are required. Examples of the films used for the semiconductor devices include a conductive thin film and an insulating thin film (see JP 2011-6783 A).

SUMMARY

With achievement of high integration and high performance of metal-oxide-semiconductor field effect transistors (MOSFETs), various types of metal films are used. A gate electrode of the MOSFET requires a work function close to energy levels of a conduction band and a valence band of material used for a substrate from a viewpoint of low power consumption. For example, an Si substrate requires a metal film having a work function near 5.0 eV in a P-type MOS and a metal film having a work function near 4.1 eV in an N-type MOS. A Ge substrate requires a metal film having a work function near 4.6 eV in a P-type MOS and a metal film having a work function near 4.1 eV in an N-type MOS. Further, a capacitor electrode of a DRAM memory requires a low-resistance metal film having a higher work function.

An objective of the present invention is to provide a technology of forming a metal film having desired a work function by adding or removing a desired element to an arbitrary metal film.

According to an aspect of the present invention, there is provided a method of manufacturing a semiconductor device including, wherein (a) to (e) are sequentially performed in the following order:

(a) forming a first mask on a first region of a metal film formed on a surface of a substrate;

(b) modulating the work function of a first exposed region of the metal film, using plasma of a first process gas;

(c) removing the first mask;

(d) forming a second mask on a second region of the metal film; and (e) modulating the work function of a second exposed region of the metal film, using plasma of a second process gas.

According to the present invention, a technology of forming a metal film having desired a work function by adding or removing a desired element to an arbitrary metal film can be provided.

BRIEF DESCRIPTION OF DRAWINGS

FIGS. 7A to 7F are explanatory views of process details in an example of the present invention.

DETAILED DESCRIPTION

Figure 1:
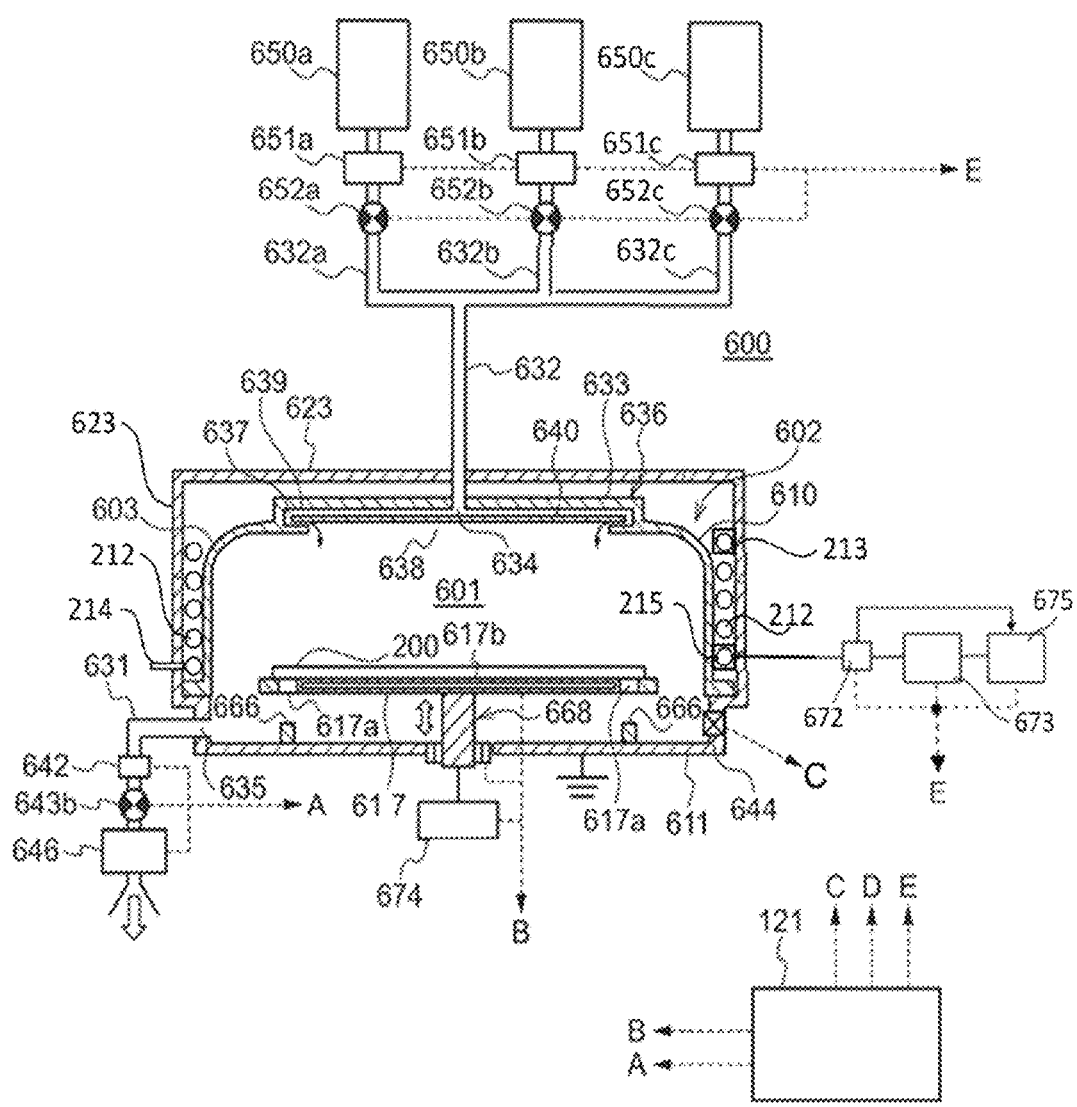
FIG. 1 is a schematic configuration diagram illustrating a processing furnace of a plasma processing apparatus favorably used in an embodiment of the present invention.

A structure of a transistor in a recent LSI manufacturing process is a gate stack structure in which a high dielectric constant film having a dielectric constant exceeding 4 is formed on silicon (Si) and a conductive thin film is further formed on the high dielectric constant film, and a threshold voltage of the transistor is controlled. In this structure, various conductive thin films are used as gate electrodes to control power consumption of the transistor.

Examples of materials that configure the gate electrodes include a metal film, for example, metal nitride films such as a TiN film and a WN film, and an elemental metal film such as a W film. Note that, in the present specification, the "metal film" means a film configured from a conductive substance including a metal element, and the "metal film" includes a film configured from a simple metal element, that is, a film containing a metal element as a main component. Further, the "metal film" includes a conductive metal nitride film, a conductive metal oxide film, a conductive metal oxynitride film, a conductive metal composite film, a conductive metal alloy film, a conductive metal silicide film, a conductive metal carbide film, and the like, in addition to the film configured from a simple metal element. Note that the TiN film and the WN film are conductive metal nitride films, and the W film is a conductive simple metal element.

A threshold voltage (Vth) of the transistor is determined by the work function of the gate electrode. The conductive thin film that configures the gate electrode has a work function (WF) unique to the thin film, and the threshold voltage can be controlled by tuning (adjusting, modulating, or controlling) the work function.

As described above, in the transistor, a required value of the work function of the gate electrode differs between a P-type transistor and an N-type transistor. Further, to suppress standby power of the transistor, a conductive thin film having a work function near a mid-gap work function is also required. Further, another value may be required depending on use. In such cases, it is desirable to adjust the work function with one film having the same elemental composition.

For example, a conductive thin film (strong p-metal) is required, in which the work function on a hafnium oxide film ($HfO_2$ film) is 4.9 eV or more, and the value of the work function is modulable.

The threshold voltage can also be controlled by adding phosphorus (P) or boron (B) to a channel, other than adjusting (modulating) the work function of the gate electrode. However, in the transistor having a three-dimensional structure as typified by a Fin FET, it is difficult to add impurities to the channel. Therefore, to control the threshold voltage, a plurality of gate electrodes having various types of work functions needs to be developed.

As described above, the TiN film has the high work function of 4.9 eV on the $HfO_2$ film. To make the work function low, aluminum (Al) or carbon (C) having a low work function is added by plasma processing to make the work function low.

Further, the work function can be decreased by pulling out nitrogen from TiN because nitrogen (N) in TiN makes the work function high. For example, after nitrogen in the film is replaced with oxygen by oxidizing the TiN film, using plasma containing oxygen (O), the oxidized TiN film is reduced by reduction processing using plasma containing hydrogen. Accordingly, the TiN film can be reformed to a Ti-rich film, and the work function can be made low.

The work function of the W film is 4.6 eV on the $HfO_2$ film. To make the work function high, nitrogen (N) or oxygen (O) having a high work function is added by plasma processing to increase the work function.

In the embodiment of the present invention, the plasma processing is performed after a mask is applied to an unnecessary portion, so that a desired element is added (injected) to, or pulled out from, only a portion of the conductive thin film that requires adjustment (modulation) of the work function. For example, in a case of forming a plurality of gate electrodes formed of a conductive thin film within a circuit, the desired element can be added (injected) to the desired thin film only by desired concentration by using the above-described technique. Therefore, gate electrodes having arbitrary different types of work functions can be formed. To be more specific, for example, agate electrode having a desired work function can be formed by adding a predetermined element to the TiN film or the W film only by desired concentration.

<Embodiment of Present Invention>

(1) Configuration of Substrate Processing System

Hereinafter, an embodiment of the present invention will be described. In the present embodiment, to perform a substrate processing process that is a process of a semiconductor device (device) manufacturing process, a substrate processing system configured from a series of substrate processing apparatuses described below is provided. That is, the substrate processing system is configured from (a) a film-forming processing apparatus used to form a thin film on a wafer 200 as a substrate, (b) an etching apparatus that processes the shape of the thin film formed on the wafer 200, (c) a series of apparatuses that form a mask on the wafer 200 on which the thin film is formed (a resist application apparatus, a baking processing apparatus, an exposure apparatus, and a developing apparatus), (d) a plasma processing apparatus 600 (see FIGS. 1 to 3) used to perform plasma processing for the wafer 200 on which the mask is formed, and (e) an asking apparatus that removes the mask on the wafer 200.

The above-described film-forming processing apparatus is used to execute a process of forming a conductive thin film, to which the plasma processing is applied, on the wafer 200, and any apparatuses that can execute the process can be appropriately selected and used. For example, various film-forming processing apparatuses such as a single wafer apparatus, a vertical batch-type apparatus, and a multi-wafer apparatus can be used.

Figure 2:
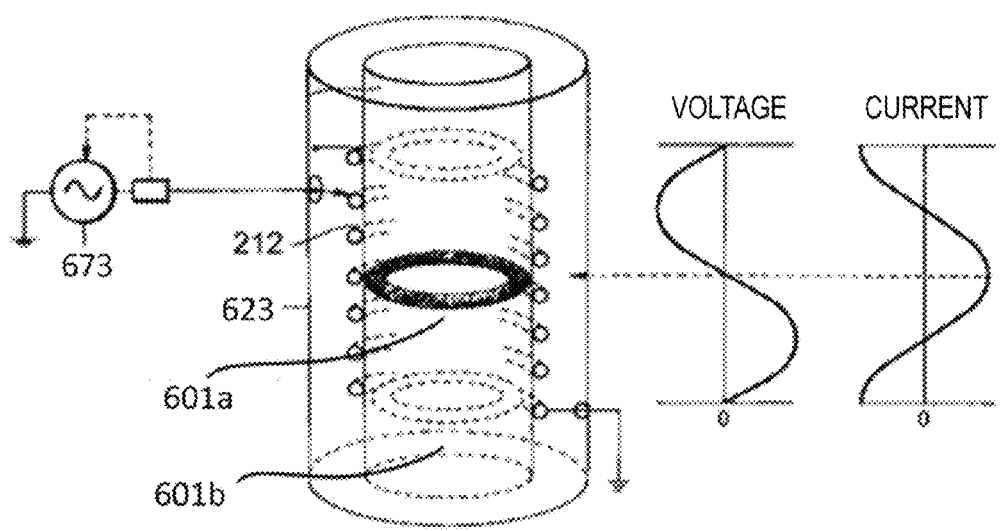
FIG. 2 is an explanatory view for describing a plasma generation principle in the processing furnace of FIG. 1.

Next, the plasma processing apparatus 600 will be described in detail with reference to FIG. 1. The plasma processing apparatus 600 includes a processing furnace 602 that performs plasma processing for the wafer 200. Then, the processing furnace 602 includes a processing container 603 that configures a processing chamber 601, a susceptor 617, a gate valve 644, a shower head 636, a gas exhaust port 635, a resonant coil 212, and a controller 121.

The processing container 603 that configures the processing chamber 601 includes a dome-shaped upper container 610 as a first container and a bowl-shaped lower container 611 as a second container. Then, the upper container 610 is put on the lower container 611 to form the processing chamber 601. The upper container 610 is formed of, for example, aluminum oxide or non-metal material such as quarts, and the lower container 611 is formed of, for example, aluminum (Al).

The susceptor 617 that supports the wafer 200 is arranged in a bottom-side center in the processing chamber 601. The susceptor 617 is formed of, for example, aluminum nitride (AlN), ceramics, or non-metal material such as quartz.

A heater 617b as a heating mechanism is integrally embedded inside the susceptor 617, and can heat the wafer 200. When power is supplied from a heater power source 674 to the heater 617b, the heater 617b can heat a surface of the wafer 200 to about 200 to 750° C., for example.

The susceptor 617 and the heater 617b mainly constitute a substrate support unit.

The susceptor 617 is provided with a susceptor lift mechanism 668 that lifts the susceptor 617. The susceptor 617 is provided with through holes 617a. Wafer push-up pins 666 that push up the wafer 200 are provided at least three places on a bottom surface of the lower container 611. Then, the through holes 617a and the wafer push-up pins 666 are arranged such that the wafer push-up pins 666 go through the through holes 617a in a non-contact state with the susceptor 617 when the susceptor 617 is lowered by the susceptor lift mechanism 668.

The gate valve (sluice valve) 644 as a loading/unloading mechanism is provided in aside wall of the lower container 611. When the gate valve 644 is open, the wafer 200 can be loaded into the processing chamber 601 and the wafer 200 can be unloaded to an outside of the processing chamber 601, using a transfer mechanism provided outside the processing chamber 601. By closing the gate valve 644, the processing chamber 601 can be air-tightly blocked. Note that the gate valve 644 and the transfer mechanism can be configured as the loading/unloading mechanism and can be controlled by the controller 121 to perform loading/unloading operations of the wafer 200. Agate valve used for loading and a gate valve used for unloading may be separately provided.

The shower head 636 that supplies a gas to the processing chamber 601 is provided in an upper portion of the processing chamber 601. The shower head 636 includes a cover body 633 on a cap, a gas introduction port 634, a buffer chamber 637, an opening 638, a shielding plate 640, and a gas outlet 639.

A downstream end of a gas supply pipe 632 that supplies a gas to the buffer chamber 637 is connected to the gas introduction port 634. The buffer chamber 637 functions as a dispersion space that disperses the gas introduced through the gas introduction port 634.

A downstream end of a gas supply pipe 632a that supplies a first reactant gas (for example, an $O_2$ gas as an oxygen (O)-containing gas), a downstream end of a gas supply pipe 632b that supplies a second reactant gas (for example, an $H_2$ gas as a hydrogen (H)-containing gas), and a downstream end of a gas supply pipe 632c that supplies a third reactant gas (for example, an $N_2$ gas as a nitrogen (N)-containing gas) are joined and connected to an upstream side of the gas supply pipe 632. Note that a mixed gas of the first reactant gas and the second reactant gas may be called fourth reactant gas.

A supply source 650a of the first reactant gas, an MFC 651a as a flow rate control device, and a valve 652a as an on-off valve are connected to the gas supply pipe 632a in order from upstream. A supply source 650b of the second reactant gas, an MFC 651b, and a valve 652b are connected to the gas supply pipe 632b in order from upstream. A supply source 650c of the third reactant gas, an MFC 651c, and a valve 652c are connected to the gas supply pipe 632c in order from upstream.

The first reactant gas, the second reactant gas, and the third reactant gas can be freely supplied to the processing chamber 601 through the buffer chamber 637 by open/close of the valves 652a, 652b, and 652c and control of the flow rate with the MFCs 651a, 651b, and 651c.

The gas exhaust port 635 that exhausts the gas in the processing chamber 601 is provided in a lower portion of a side wall of the lower container 611. An upstream end of a gas exhaust pipe 631 that exhausts the gas is connected to the gas exhaust port 635. An APC valve 642 as a pressure regulator, a valve 643b as an on-off valve, and a vacuum pump 646 as an exhaust device are provided in the gas exhaust pipe 631 in order from upstream. By operating the vacuum pump 646 and opening the valve 643b, the processing chamber 601 can be evacuated. Further, by adjusting the degree of opening of the APC valve 642, a pressure value in the processing chamber 601 can be regulated.

The spiral resonant coil 212 as a first electrode is provided on an outer peripheral portion of the processing chamber 601, that is, on an outside of a side wall of the upper container 610. An RF sensor 672, a high-frequency power source 673, and a frequency matching device 675 are connected to the resonant coil 212. The resonant coil 212 functions as a discharging mechanism (a plasma generating mechanism, a plasma forming mechanism, or an activating mechanism) that excites the gas supplied into the processing chamber 601 to generate plasma.

The high-frequency power source 673 supplies high-frequency power to the resonant coil 212. The RF sensor 672 is provided on an output side of the high-frequency power source 673. The RF sensor 672 monitors information of a traveling wave and a reflection wave of the supplied high-frequency. The frequency matching device 675 controls the high-frequency power source 673 such that the reflection wave becomes the least on the basis of the information of the reflection wave monitored by the RF sensor 672.

Both ends of the resonant coil 212 are electrically grounded. At least one of the ends of the resonant coil 212 is grounded through a movable tap 213 to finely adjust an electrical length of the resonant coil at the time of initial installation of the apparatus or change of processing conditions. The reference sign 214 in FIG. 1 represents the other fixed ground. Further, the movable tap 215 configures a feeding unit between the grounded both ends of the resonant coil 212 to finely adjust impedance of the resonant coil 212 at the time of initial installation of the apparatus or change of processing conditions.

A shielding plate 623 is provided to shield leakage of an electromagnetic wave to an outside of the resonant coil 212, and to form a capacitive component necessary to configure a resonant circuit between the shielding plate 623 and the resonant coil 212.

In this way, a plasma generating unit that can generate inductively coupled plasma (ICP) is configured. Here, a principle of plasma generation of the apparatus according to the present embodiment and characteristics of generated plasma will be described using FIG. 2.

The resonant coil 212 forms a standing wave having a predetermined wavelength, and thus a winding diameter, a winding pitch, and the number of turns are set such that the resonant coil 212 resonates in all wavelength modes. That is, the electrical length of the resonant coil 212 is set to integral multiple of one wave length in a predetermined frequency of the power provided by the high-frequency power source 673.

To be specific, the resonant coil 212 has an effective sectional area of 50 to 300 mm$^2$ and a coil diameter of 200 to 500 mm, and is wound around an outer peripheral side of a room that forms a plasma generation space 601a about twice to sixty times so that the resonant coil 212 can generate a magnetic field of about 0.01 to 10 gauss by the high-frequency power of from 800 kHz to 50 MHz, and from 0.5 to 5 KW.

A waveform adjusting circuit made of a coil and a shield is inserted into one end or both ends of the resonant coil 212 so that a phase current and a reverse phase current flow symmetrically with respect to an electrical midpoint of the resonant coil 212.

The high-frequency power source 673 includes power source control means (a control circuit) including a high-frequency oscillation circuit for defining an oscillation frequency and an output and a preamplifier, and an amplifier (output circuit) for amplifying the output to a predetermined output.

In a case where the wavelength of the high-frequency power source 673 and the electrical length of the resonant coil 212 are the same, a resonance condition of the resonant coil 212 is that a reactance component created by a capacitive component and an inductive component of the resonant coil 212 is offset, and the resonant coil 212 becomes pure resistance. However, when the plasma is generated in the plasma generation circuit, the actual resonant frequency slightly varies due to capacitive coupling between a voltage portion of the resonant coil 212 and the plasma, variation of inductive coupling between the plasma generation space 601a and the plasma, and an excited state of the plasma.

Therefore, in the present embodiment, the frequency matching device 675 has a function to detect reflection wave power from the resonant coil 212 of when plasma has occurred and to complement an output, in order to compensate resonance shift in the resonant coil 212 at the time of occurrence of the plasma at the power source side. With the configuration, a resonator of the present invention can more accurately form the standing wave in the resonant coil 212, and can generate the plasma with extremely little capacitive coupling.

Figure 3:
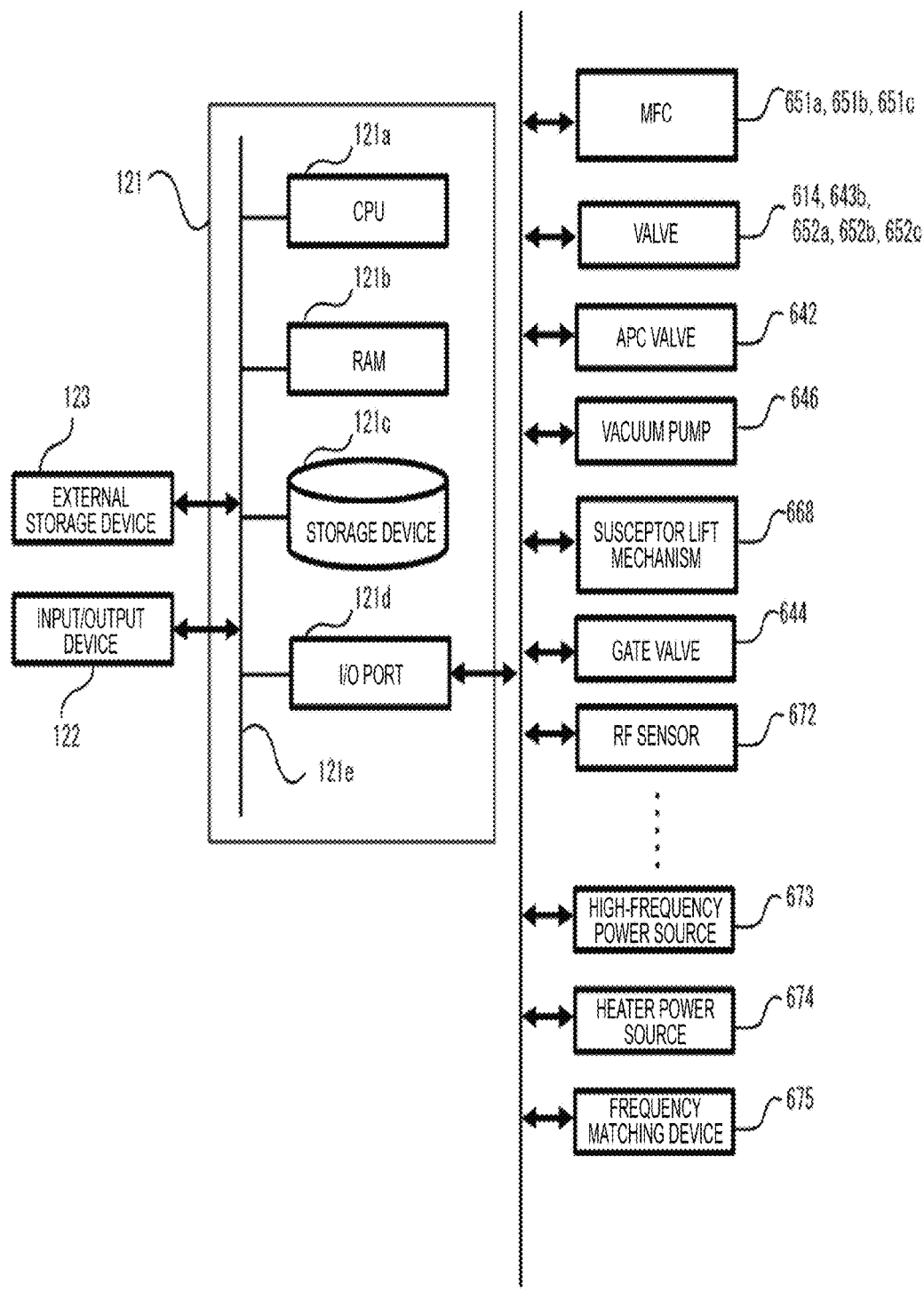
FIG. 3 is a block diagram illustrating a configuration of a controller of the plasma processing apparatus favorably used in an embodiment of the present invention.

As illustrated in FIG. 3, the controller 121 as a control unit (control means) is configured as a computer that includes a central processing unit (CPU) 121a, a random access memory (RAM) 121b, a memory device 121c, and an I/O port 121d. The RAM 121b, the memory device 121c, and the I/O port 121d are configured to be able to exchange data with the CPU 121a through an internal bus 121e. An input/output device 122 configured as a touch panel and the like is connected to the controller 121.

The memory device 121c is configured from a flash memory, a hard disk drive (HDD), and the like. A control program for controlling an operation of a substrate processing apparatus, a process recipe in which procedures and conditions of substrate processing described later are described, and the like are readably stored in the memory device 121c. The process recipe is combined to cause the controller 121 to execute procedures in the substrate processing process described later to obtain a predetermined result, and functions as a program. Hereinafter, the process recipe, the control program, and the like may be collectively and simply called program. Further, the process recipe may be simply called recipe. In the present specification, when the term "program" is used refers to a case of including only the recipe, a case of including only the control program, or a case of including both the recipe and the program. Further, the RAM 121b is configured as a memory area in which a program, data, and the like read by the CPU 121a are temporarily held.

The I/O port 121d is connected with the MFCs 651a to 651c, the valves 614, 643b, and 652a to 652c, the APC valve 642, the vacuum pump 646, the susceptor lift mechanism 668, the gate valve 644, the RF sensor 672, the frequency matching device 675, the high-frequency power source 673, and the heater power source 674 described above.

The CPU 121a is configured to read the control program from the memory device 121c and execute the control program, and read the recipe from the memory device 121c in response to an input of an operation command from the input/output device 122, or the like. The CPU 121a is configured to control, according to the read recipe, flow rate adjustment operations of the gases by the MFCs 651a to 651c, open/close operations of the valves 614, 643b, and 652a to 652c, an open/close operation of the APC valve 642, an temperature adjustment operation of the heater 617b by the heater power source 674, start and stop of the vacuum pump 646, a lift operation of the susceptor 617 by the susceptor lift mechanism 668, an open/close operation of the gate valve 644, a matching operation of impedance by the RF sensor 672 and the frequency matching device 675, a supply amount adjustment operation of high-frequency power to be supplied to the resonant coil 212 by the high-frequency power source 673, and the like.

The controller 121 can be configured by installing the above-described program stored in an external memory device 123 to the computer. The memory device 121c and the external memory device 123 are configured as computer-readable recording media. Hereinafter, these memories are collectively and simply called recording medium. In the present specification, when the term "recording medium" is used refers to a case of including only the memory device 121c, a case of including only the external memory device 123, or a case of including both the memory device 121c and the external memory device 123. Note that providing of the program to the computer may be performed using communication means such as the Internet or a dedicated line, without using the external memory device 123.

(2) Substrate Processing Process

Next, an example (first embodiment) of forming a gate electrode configured from a conductive thin film on the wafer 200, then adjusting (modulating) the work function of the conductive thin film that configures the gate electrode by plasma processing, and obtaining the gate electrode having a desired work function, using the above-described substrate processing system, as a process of a semiconductor device manufacturing process, will be described.

Figure 4:
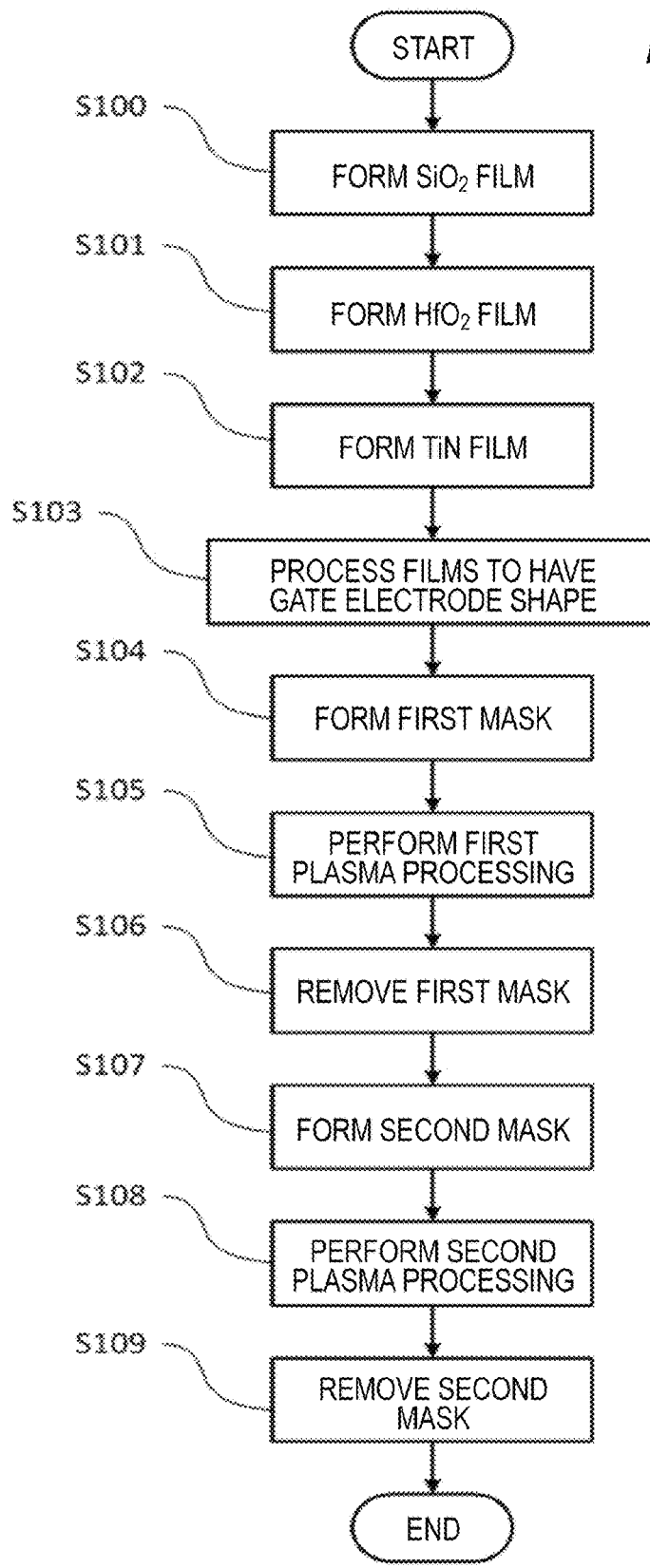
FIG. 4 is a flowchart of electrode formation in an embodiment of the present invention.

In the present embodiment, a series of processes of forming the gate electrode having a desired work function will be described with reference to FIGS. 4 to 6. FIG. 4 illustrates a flow example of processes of forming the gate electrode and for adjusting the work function, and FIGS. 5A to 6D illustrate sectional views of a device in the processes. In the processes of the present embodiment, a transistor having a stack structure in which an $SiO_2$ film and an $HfO_2$ film as gate insulating films and a TiN film as a conductive thin film that configures the gate electrode are laminated on the wafer 200 in this order is formed, as illustrated in the sectional view in FIG. 5A.

(Formation of Gate Insulating Film: S100 and S101)

First, an $SiO_2$ film 22 and an $HfO_2$ film 24 as gate insulating films are formed on the wafer 200 as a substrate.

(Formation of TiN Film: S102)

Next, a metal film is formed on the $HfO_2$ film, as a conductive thin film that configures the gate electrode, a value of the work function of the metal film being controlled by plasma processing described later. In the present embodiment, a TiN film 26 is formed as the metal film.

For formation of the above-described gate insulating films (the $SiO_2$ film 22 and the $HfO_2$ film 24) and the conductive thin film (the TiN film 26), the film-forming techniques such as a chemical vapor deposition (CVD) method, an atomic layer deposition (ALD) method, a physical vapor deposition (PVD) method, and an application method can be appropriately used in the above-described film-forming processing apparatus, for example.

(Processing to Gate Electrode Shape: S103)

Figure 5A:
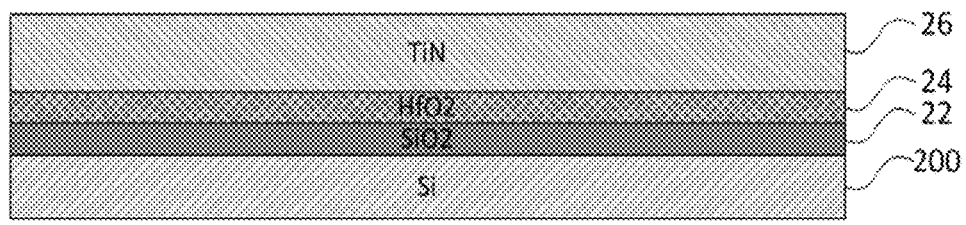
FIGS. 5A to 5D are explanatory views of a process concept in an embodiment of the present invention.
Figure 5B:
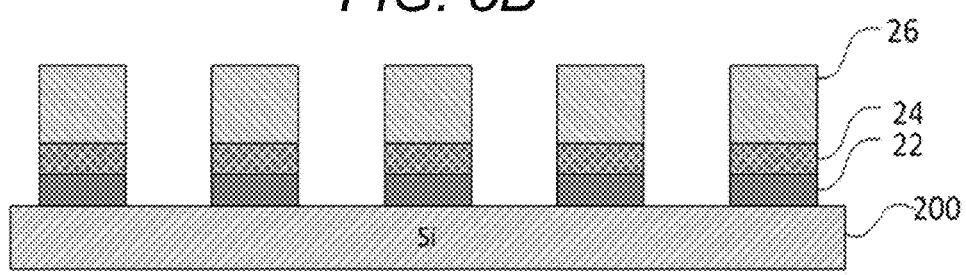

After the TiN film 26 is formed, the $SiO_2$ film 22, the $HfO_2$ film 24, and the TiN film 26 are processed to have a desired gate electrode shape (see FIG. 5B). In the present embodiment, a plurality of gate electrodes are formed on the wafer 200, by forming grooves (trenches) by etching processing, using the above-described etching apparatus. Note that the gate electrode referred below is the TiN film 26 individually separated by the present process or a film obtained by applying modulation processing of the work function to the TiN film 26.

(Formation of First Mask: S104)

Figure 5C:
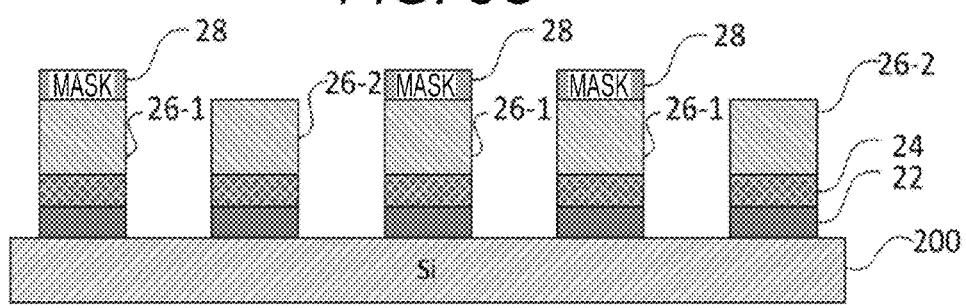

Next, as illustrated in the sectional view of FIG. 5C, a mask (first mask 28) is formed on a desired gate electrode (first electrode 26-1 as a first masked region), of the plurality of gate electrodes. In the present process, first plasma processing described later is performed for a gate electrode (second electrode 26-2 as a first exposed region) which no mask is formed on and is exposed to a processing space, and modulation of the work function is applied. For formation of the mask, any technique of forming a mask can be appropriately selected and used. In the present embodiment, as a photoresist used for the mask, a cyclized rubber-based resin or a phenol-based resin can be used. Any material can be appropriately selected as long as the mask effect can be obtained by the material in the processing for the gate electrode in the plasma processing described later.

The mask is formed by the procedure below, for example.
(a) The photoresist is applied on a surface of the wafer 200, using the resist application apparatus.
(b) Baking processing (pre-baking processing) is applied to the photoresist applied on the wafer 200, using a heat processing apparatus.
(c) Exposure processing for the baking-processed photoresist is performed using the exposure apparatus. To be specific, in a case of using a positive photoresist, for example, a region other than the region where the first mask 28 is to be formed is irradiated (exposed) with ultraviolet rays, and a pattern of a photomask is transferred.
(d) Developing processing is performed for the exposure-processed photoresist, using the developing apparatus. To be specific, the photoresist on the region other than the region where the first mask 28 is to be formed is removed with a developing solution, and the first mask 28 is formed. Further, post-baking processing, curing processing by irradiation with ultraviolet rays, and the like are performed to the first mask 28 as needed.

(First Plasma Processing: S105)

Figure 5D:
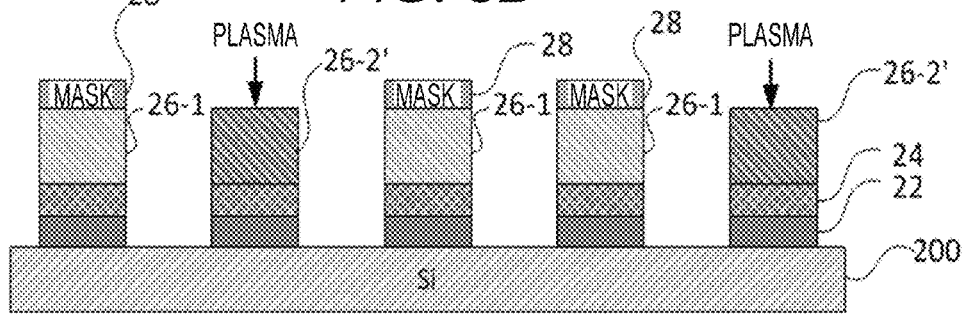

Next, as illustrated in the sectional view of FIG. 5D, the plasma processing is performed for the wafer 200 on which the first mask is formed. The present process can be executed using the above-described plasma processing apparatus 600. In the present process, the work function of the second electrode 26-2 is adjusted (modulated) by doping (injecting) the second electrode 26-2 where no first mask 28 is formed with a predetermined element and pulling out (separating) the predetermined element from the second electrode 26-2, by supplying reactive species (e.g. radicals, active species, etc) generated from the plasma-excited first process gas (for example, at least any of the first to fourth reactant gasses) to the wafer 200. That is, by applying the first plasma processing to the second electrode 26-2, a second electrode 26-2' with the adjusted (modulated) work function is obtained. Note that the present process is not limited to only one time of the plasma processing using one plasma-excited first process gas. In the present process, after the plasma processing using one first process gas, another plasma processing may be sequentially performed using another plasma-excited first process gas.

To make the work function low, of the TiN film that configures the second electrode 26-2, for example, an N atom as an element having a high work function is pulled out from the TiN film by the plasma processing. To be specific, first, the $O_2$ gas as the plasma-excited first process gas is supplied to the TiN film, and the N atom in the film is replaced with an O atom. After that, the $H_2$ gas as another plasma-excited first process gas is supplied to the TiN film, and the O atom contained in the TiN film is removed (reduced), whereby the N atom in the TiN film can be pulled out.

Further, the work function of the TiN film can be made low by adding an element having a low work function, for example, at least any of C, Al, and Si atoms to the TiN film by the plasma processing. For example, the C atom can be added (injected) to the film by supplying reactive species generated from a plasma-excited C-containing gas (a $C_2H_6$ gas, a $CH_4$ gas, or the like) as the first process gas to the TiN film. Further, the Si atom can be added (injected) to the film by supplying reactive species generated from a plasma-excited Si-containing gas ($SiH_4$, monochlorosilane, a silane-based gas containing one or more H and Si, or the like) as the first process gas to the TiN film.

Meanwhile, to make the work function high, of the TiN film that configures the second electrode 26-2, an element having a high work function, for example, at least any of N and O atoms to the TiN film by the plasma processing is added (injected) to the TiN film. For example, the N atom can be added (injected) to the film by supplying reactive species generated from a plasma-excited N-containing gas (an $N_2$ gas, an $NH_3$ gas, or the like) as the first process gas to the TiN film. Further, the O atom can be added (injected) to the film by supplying reactive species generated from a plasma-excited $O_2$ gas to the TiN film.

(Removal of First Mask: S106)

Figure 6A:
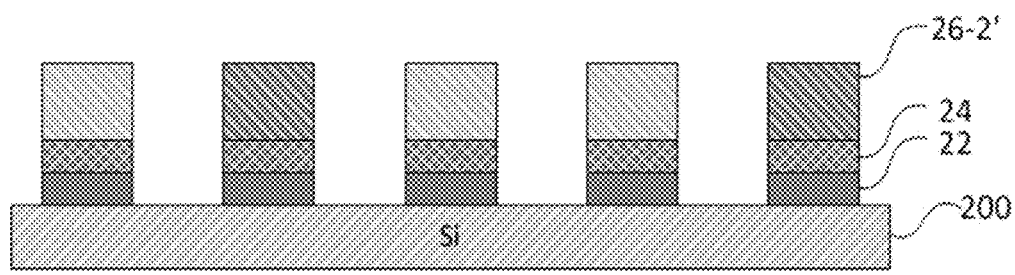
FIGS. 6A to 6D are diagrams following FIGS. 5A to 5D.

After the first plasma processing process (S105), the first mask 28 is removed (see FIG. 6A). The present process can be performed using the asking apparatus, for example. In a case of adjusting the work function of only the second electrode 26-2, the series of processes are terminated in the present process. On the other hand, in a case of adjusting the work function of the first electrode 26-1, or a case of further adjusting the work function of a specific gate electrode of second electrodes 26-2', following processes are executed.

(Formation of Second Mask: S107)

Figure 6B:
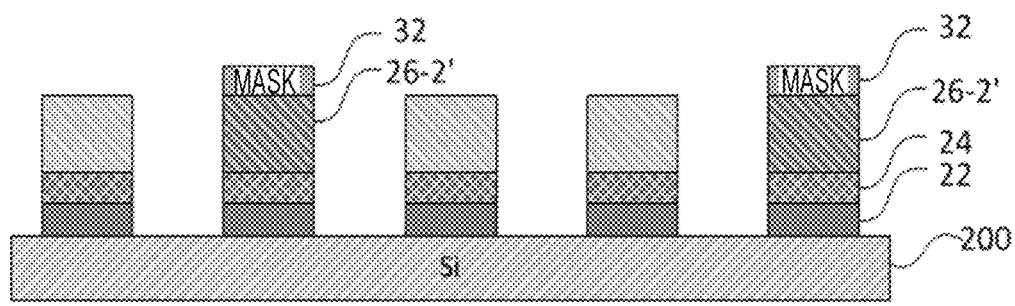

As illustrated in the sectional view of FIG. 6B, a second mask 32 is formed on the second electrode 26-2' with the adjusted work function as a second masked region.

(Second Plasma Processing: S108)

Figure 6C:
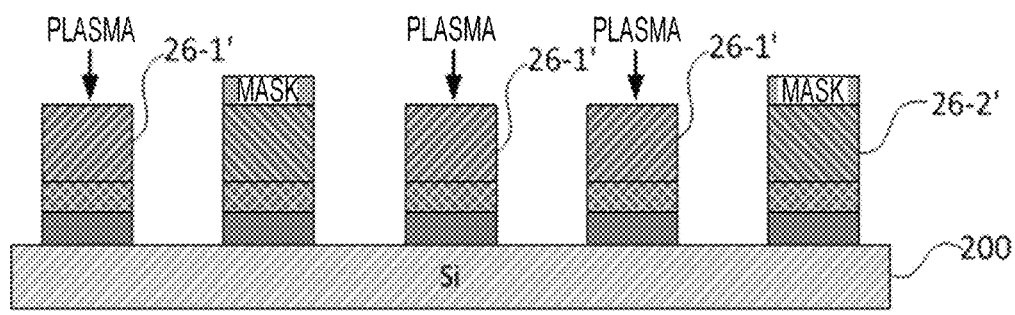

As illustrated in the sectional view of FIG. 6C, the plasma processing is performed for the wafer 200 on which the second mask 32 is formed. In the present process, similar to the first plasma processing (S105), the work function of the first electrode 26-1 as a second exposed region is adjusted by doping (injecting) the first electrode 26-1, which no second mask 32 is formed on and is exposed to a processing space, with a predetermined element and pulling out the predetermined element from the first electrode 26-1, by supplying the wafer 200 with the plasma-excited second process gas (for example, at least any of the first to fourth reactant gases). That is, a first electrode 26-1' with the adjusted work function can be obtained by applying second plasma processing to the first electrode 26-1.

In the process of forming the second mask (S107), the mask may be formed on only a part of the second electrodes 26-2', instead of all the second electrodes 26-2'. Further, the mask may be formed on a part of the first electrodes 26-1. That is, the second mask 32 can be formed to mask a region, at least a part of which is different from the region masked with the first mask 28. In this case, the second plasma processing (S108) can be redundantly applied to the second electrode 26-2' or any plasma processing may not be applied to the first electrode 26-1.

(Removal of Second Mask: S109)

Figure 6D:
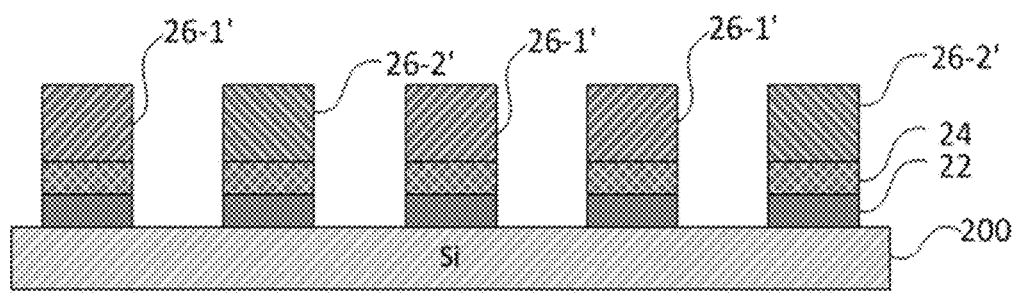

After the second plasma processing process (S108), the second mask 32 is removed (see FIG. 6D). The first electrode 26-1' and the second electrode 26-2' with the adjusted work function are formed on the wafer 200 by the above series of processes (S100 to S109). In a case of further adjusting the work function of a specific gate electrode, of the first electrode 26-1' and the second electrode 26-2' with the adjusted work function, a series of processes including the process of forming the mask on the gate electrodes other than the desired gate electrode, and the plasma processing process and the process of removing the mask for the desired gate electrode may be further executed once or a plurality of times. For example, a process of forming a third mask, third plasma processing using plasma of a third process gas, and a process of removing the third mask may be further performed.

Note that, in the present embodiment, an example of using the $HfO_2$ film as the gate insulating film has been described. However, the present invention is not limited to the example, and for example, the present invention can be applied to a case of using a high dielectric constant insulating film such as $TiO_2$, $ZrO_2$, $Nb_2O_5$, $Ta_2O_5$, SrTiO, BaSrTiO, PZT, or $Al_2O_3$, or a film obtained by adding (doping) the high dielectric constant insulating film with a semimetal element such as Si or B, or a metal element such as Al, or a case of using a film formed by laminating the aforementioned films. Further, in the present embodiment, a case of directly forming the conductive thin film (metal film) with the adjusted work function on the gate insulating film has been described. However, the present invention is not limited to the example, and can be applied to a case of forming a barrier layer between the conductive thin film with the adjusted work function and the gate insulating film.

The present embodiment can be applied not only to the gate electrode used in a MOSFET or a DRAM, for example, but also in a process that requires adjustment of the work function of the conductive thin film, such as a case of adjusting the work function of the W film used as a control gate of a flash memory, for example.

<Favorable First Example of Present Invention>

Next, an example (first example) of a device manufacturing process to which the present invention is favorably applied will be described with reference to FIGS. 7A to 7F.

Further, a process of performing the plasma processing, using the plasma processing apparatus 600, will be especially described in detail.

FIGS. 7A to 7F are schematic sectional views illustrating a process of forming an N-type MOS 300n and a P-type MOS 300p having the Fin FET structure and formed on the wafer 200. These structures are formed on the surface of the same wafer 200.

First, as illustrated in FIG. 7A, the structure that configures the N-type MOS 300n and the structure that configures the P-type MOS 300p are formed of a similar structure. That is, the N-type MOS structure 300n is formed such that an Si layer 301n that forms a channel portion, a source electrode 302n, a drain electrode 303n, an $SiO_2$ film 304n as an insulating layer, an SiN film 305n and an $HfO_2$ film 306n as gate insulating films, and a TiN film 307n as a gate electrode are laminated as described in FIG. 7A. Similarly, the P-type MOS structure 300p is formed such that an Si layer 301p, a source electrode 302p, a drain electrode 303p, an $SiO_2$ film 304p as an insulating layer, an SiN film 305p and an $HfO_2$ film 306p as gate insulating films, and a TiN film 307p as a gate electrode are laminated as illustrated in FIG. 7A. In the Fin FET structure, the Si layers 301n and 301p that form the channel portion are formed into a fin shape.

Here, as described above, in the transistor having a three-dimensional structure as typified by a Fin FET, it is difficult to adjust the threshold voltage by adding impurities to a channel portion. As another method not by the present invention, for example, gate electrodes to be used for the N-type MOS and the P-type MOS are each formed of metal films having different types of work function. That is, first, after a P-type MOS gate electrode is formed on the gate insulating film for both the N-type MOS and P-type MOS, the P-type MOS gate electrode on the N-type gate insulating film is removed by etching. After that, the N-type MOS gate electrode is formed on both the N-type gate insulating film and the P-type MOS gate electrode, so that the N-type MOS gate electrode is formed on the N-type gate insulating film, and the gate electrode in which the P-type MOS gate electrode and the N-type MOS gate electrode are laminated is formed on the P-type gate insulating film. This laminated gate electrode is used as the P-type MOS gate electrode. However, in this case, the P-type MOS gate electrode is formed of the laminated film, and thus the film thickness must be large, and design of the device is restricted.

In contrast, according to the present invention, one type of gate electrode film (the TiN film in the first example) is formed on both the N-type and the P-type electrodes, and the mask formation and the plasma processing are combined, thereby to adjust the work function tailored to the N-type and P-type gate electrodes. Therefore, the degree of freedom of design of the device can be secured without making the film thickness large.

(Formation of First Mask: S104')

After the structure illustrated in FIG. 7A is formed, a mask is formed on either the TiN film 307n or the TiN film 307p (S104'). This is a process corresponding to the first mask forming process (S104) in the description of the first embodiment. In the first example, as illustrated in FIG. 7B, a first mask 308p is first formed on the TiN film 307p. As another example, the mask may be first formed on the TiN film 307n.

(First Plasma Processing: S105')

Next, as illustrated in FIG. 7C, adjustment of the work function is applied to the TiN film 307n on which no mask is formed by the plasma processing so that the TiN film 307n becomes a film having a necessary work function as the gate electrode to be used for the N-type MOS (S105'). This is a process corresponding to the first plasma processing process (S105) described in the first embodiment. In the first example, N contained in the film and O are replaced (that is, the film is oxidized) by supplying reactive species generated from a plasma-excited oxygen ($O_2$) gas to the TiN film 307n, and then, the O atom contained in the film is removed (reduced) by supplying reactive species generated from a plasma-excited hydrogen ($H_2$) gas. By the present processing, a TiN film 307n' in which the work function is decreased to become low can be obtained.

(Removal of First Mask and Formation of Second Mask: S106' and S107')

After the first plasma processing (S105'), the first mask 308p is removed (S106'), and a second mask 308n is then formed on the TiN film 307n' (S107') (see FIG. 7D). This process corresponds to the first mask removal process (S106) and the second mask formation process (S107) in the description of the first embodiment.

(Second Plasma Processing: S108')

Next, as illustrated in FIG. 7D, adjustment of the work function is applied to the TiN film 307p on which no mask is formed by the plasma processing so that the TiN film 307p can have a necessary function as the gate electrode to be used for the P-type MOS (S108').

This process corresponds to the second plasma processing process (S108) in the description of the first embodiment. In the first example, reactive species generated from a plasma-excited gas ($N_2$ gas) is supplied to the TiN film 307p, and the N atom is added (injected) to the film. By the present processing, a TiN film 307p' in which the work function is adjusted to become low can be obtained.

(Removal of Second Mask: S109')

After the second plasma processing (S108'), the second mask 308n is removed (S109').

By performing the above series of processes (S104' to S109'), the TiN film 307n' and the TiN film 307p' having different types of work function can be formed on the one sheet of wafer 200. After that, a metal electrode film of tungsten or the like is formed in trenches formed by the TiN film 307n' and the TiN film 307p', so that the N-type MOS structure 300n and the P-type MOS structure 300p are formed (see FIG. 7F).

Note that, in the first example, the work function of the TiN film has been decreased by the plasma processing with the $O_2$ gas and the plasma processing with the $H_2$ gas, and the work function of the TiN film has been increased by the plasma processing with the $N_2$ gas. However, an example is not limited thereto, and the work function can be adjusted using any of or a combination of the above-described plasma processing processes of adjusting the work function.

<Example of First Plasma Processing>

Hereinafter, an example of the process of performing the first plasma processing (S105') using the plasma processing apparatus 600 will be described in detail. In the following description, operations of units that configure the plasma processing apparatus 600 are controlled by the controller 121.

(Wafer Loading)

First, the wafer 200 on which the N-type MOS 300n, the P-type MOS 300p, and the first mask 308p are formed as illustrated in FIG. 7B is transferred into the processing chamber 601 of the plasma processing apparatus 600. To be specific, the gate valve 644 is opened, and the wafer 200 is placed on the push-up pins 666, using the transfer mechanism provided outside the processing chamber 601. By lowering the susceptor 617 to a transferred position of the wafer 200, the push-up pins 666 protrude from the surface of the susceptor 617 by a predetermined height. When the wafer 200 is transferred into the processing chamber 601, the gate valve 644 is closed and the processing chamber 601 is sealed, and the susceptor 617 is raised to a predetermined position, so that the wafer 200 is arranged on the upper surface of the susceptor 617.

(Pressure/Temperature Adjustment and $O_2$ Gas Supply)

Next, the power is supplied to the heater 617b, and the wafer 200 is heated. The temperature of the wafer 200 is a predetermined temperature within a range from the room temperature to 700° C., favorably a range from the room temperature to 500° C., and more favorably a range from the room temperature to 400° C. After that, the $O_2$ gas is introduced (supplied) from the first reactant gas supply source 650a to the processing chamber 601. At this time, the degree of opening of the MFC 651a is adjusted such that the flow rate of the $O_2$ gas becomes a predetermined flow rate. The flow rate of the $O_2$ gas to be supplied to the processing chamber 601 is a predetermined flow rate within a range from 0.01 to 10 slm, favorably from 0.05 to 5 slm, and more favorably from 0.1 to 1 slm. If the flow rate is larger than 10 slm, the pressure in the processing chamber becomes high, and the plasma may not be discharged.

An atmosphere in the processing chamber 601 is evacuated using the vacuum, pump 646 and the APC valve 642, and is adjusted such that the pressure in the processing chamber 601 becomes a predetermined pressure within a range from 1 to 260 Pa, favorably from 5 to 200 Pa, and more favorably from 10 to 150 Pa. If the pressure is higher than 260 Pa, the plasma may not be discharged. Further, if the pressure is smaller than 1 Pa, the number of elements to be made into plasma becomes small, and the number of ionized elements becomes larger than radical elements, and plasma damage may become high.

($O_2$ Plasma Processing)

After the $O_2$ gas is introduced into the processing chamber 601, when the high-frequency power is applied from the high-frequency power source 673 to the resonant coil 212, an induction field is formed in the plasma generation space 601a, and torus-shaped induction plasma is excited in a position corresponding to the electrical midpoint of the resonant coil 212 in the plasma generation space, by the induction field. The plasma-excited $O_2$ gas is dissociated, and reactive species such as oxygen active species and oxygen ions are generated. When the activated $O_2$ gas is supplied to the TiN film 307n exposed on the wafer 200, the TiN film 307n is oxidized, and the N atom in the film is replaced with the O atom.

The power (RF power) applied to the resonant coil 212 is predetermined power within a range from 10 to 3000 W, favorably from 10 to 2000 W, and more favorably from 10 to 1000 W. To suppress the plasma damage, the power is desirably 3000 W at most. If the power is smaller than 10 W, the effect of the plasma processing may not be able to be obtained. The plasma processing with the $O_2$ gas ($O_2$ plasma processing) is performed for a predetermined time within a range from 1 to 120 seconds, favorably a range from 2 to 60 seconds, and more favorably from a range 5 to 30 seconds. When the $O_2$ plasma processing is terminated, the power supply to the resonant coil 212 is stopped.

Note that a mixed gas to which the $H_2$ gas is added together with the $O_2$ gas may be used in the $O_2$ plasma processing. In this case, a flow rate ratio of the $O_2$ gas and the $H_2$ gas is about $O_2:H_2=95:5$, or the ratio of the $H_2$ gas is desirably made smaller than the aforementioned ratio.

($O_2$ Gas Supply Stop)

After the $O_2$ plasma processing, the valve 652a is closed, and supply of the $O_2$ gas to the processing chamber 601 is stopped.

($H_2$ Gas Supply)

Next, the $H_2$ gas is introduced from the second reactant gas supply source 650b to the processing chamber 601. At this time, the degree of opening of the MFC 651b is adjusted such that the flow rate of the $H_2$ gas becomes a predetermined flow rate. The flow rate of the $H_2$ gas to be supplied to the processing chamber 601 is a predetermined flow rate within a range from 0.01 to 10 slm, favorably a range from 0.05 to 5 slm, and more favorably a range from 0.1 to 1 slm. The pressure in the processing chamber 601 is a predetermined pressure within a range from 1 to 260 Pa, favorably a range from 5 to 200 Pa, and more favorably a range from 10 to 150 Pa.

($H_2$ Plasma Processing)

After the $H_2$ gas is introduced into the processing chamber 601, when the high-frequency power is applied from the high-frequency power source 673 to the resonant coil 212, the $H_2$ gas in the processing chamber 601 is excited into plasma, similarly to the $O_2$ plasma processing. The plasma-excited $H_2$ gas is dissociated, and reactive species such as hydrogen active species and oxygen ions are generated. When the activated $H_2$ gas is supplied to the TiN film 307n to which the O atom is added by the $O_2$ plasma processing and exposed on the wafer 200, the O atom in the film of the TiN film 307n is removed (separated). That is, when the $O_2$ plasma processing and the plasma processing ($H_2$ plasma processing) with the $H_2$ gas are performed, the concentration of the N atom in the film of the TiN film 307n is decreased, and the work function is decreased. Accordingly, the TiN film 307n' in which the work function is adjusted to be decreased can be obtained.

The $H_2$ plasma processing is performed for a predetermined time within a range from 1 to 120 seconds, favorably a range from 2 to 60 seconds, and more favorably a range from 5 to 30 seconds. After the $O_2$ plasma processing is terminated, the power supply to the resonant coil 212 is stopped. In the first example, the power applied to the resonant coil 212 is similar to that of the $O_2$ plasma processing, but a condition may be made different.

(Residual Gas Removal)

After termination of the $H_2$ plasma processing, the valve 652b is closed, and supply of the $H_2$ gas to the processing chamber 601 is stopped. The residual gas in the processing chamber 201 is exhausted by the vacuum pump 646.

(Heating Stop, Purge, and Atmospheric Pressure Restoration)

After that, when the valve 652c is opened, the $N_2$ gas is supplied to the processing chamber 601 through the buffer chamber 637, and the gas exhaust pipe 631 is evacuated, so that the processing chamber 601 is purged with the $N_2$ gas. After that, the atmosphere in the processing chamber 601 is replaced with the $N_2$ gas, and the pressure in the processing chamber 601 is restored to normal pressure.

(Wafer Unloading)

After that, the susceptor 617 is lowered to the transferred position of the wafer 200, the wafer 200 supported on the wafer push-up pins 666 protruding from the surface of the susceptor 617 is unloaded to an outside of the processing chamber 601 through the gate valve 644.

<Example of Second Plasma Processing>

Hereinafter, an example of the process of performing the second plasma processing (S108') using the plasma processing apparatus 600 will be described in detail. Note that processes other than processes described below are similar to those of the example of the first plasma processing, and are thus omitted.

(Pressure/Temperature Adjustment and $N_2+H_2$ Gas Supply)

After the wafer charge process, the power is supplied to the heater 617b and the wafer 200 is heated to a predetermined temperature, similarly to the example of the first plasma processing. After that, the valves 652c and 652b are opened, and the mixed gas of the $N_2$ gas and the $H_2$ gas is introduced into the processing chamber 601. The flow rate of the $N_2$ gas to be supplied to the processing chamber 601 is a predetermined flow rate within a range from 0.04 to 5 slm, favorably a range from 0.02 to 1 slm, and more favorably 0.2 slm. The flow rate of the $H_2$ gas to be supplied to the processing chamber 601 is a predetermined flow rate within a range from 0.02 to 1 slm, favorably a range from 0.02 to 0.5 slm, and more favorably 0.2 slm. Further, a ratio of the $N_2$ gas and the $H_2$ gas is a predetermine ratio within a range of $N_2$ gas:$H_2$ gas=1:10 to 10:1, favorably a range from 1:5 to 5:1, and more favorably 1:1.

The pressure in the processing chamber 601 is adjusted to become a predetermined pressure within a range from 1 to 250 Pa, favorably a range from 5 to 10 Pa, and more favorably 5 Pa. If the pressure falls within a range of 50 Pa or more, modification effect by addition of the N atom can be hardly expected.

($N_2+H_2$ Plasma Processing)

After the mixed gas is introduced into the processing chamber 601, when the high-frequency power is applied to the resonant coil 212, the mixed gas is excited into plasma. The plasma-excited $N_2$ gas and $H_2$ gas are is dissociated, and reactive species such as hydrogen active species, hydrogen ions, nitrogen active species, and nitrogen ions are generated. When the activated mixed gas is supplied to the TiN film 307p exposed on the wafer 200, the N atom is added (injected) to the film of the TiN film 307p (the film is nitrided). That is, when the plasma processing ($N_2+H_2$ plasma processing) with the mixed gas of the $N_2$ gas and the $H_2$ gas is performed, the concentration of the N atom in the film of the TiN film 307p is increased, and the work function is increased. Accordingly, the TiN film 307p' in which the work function is adjusted to become low can be obtained.

In the example of the first plasma processing and the example of the second plasma processing, an example of executing the plurality of plasma processing processes using one plasma processing apparatus 600 has been described. However, different plasma processing apparatuses may be used to execute different plasma processing processes.

In the above-described embodiment, an example of forming the TiN film as a thin film, the work function of which is adjusted, has been described. However, an example is not limited thereto. The present invention can be applied to a film made of a single element such as Ti, Ta, W, Co, Y, Ru, Al, Hf, Zr, Mo, or Si, a film of any of a nitride film, an oxide film, a carbide film, or a boride film, which contains the aforementioned elements, or a composite film of the aforementioned films. Therefore, instead of using the TiN film, the work function of the thin film, the work function of which is adjusted, can be decreased by removing the element having a high work function from the thin film by the plasma processing, and the work function of the thin film can be increased by adding the element by the plasma processing. Further, the work function of the thin film, the work function of which is adjusted, can be increased by removing the element having a low work function from the thin film by the plasma processing, and the work function of the thin film can be decreased by adding the element by the plasma processing.

In a case of forming the film containing the above-described elements, $TiF_4$, $TaCl_5$, $TaF_5$, $WCl_6$, $WF_6$, $CoCl_2$, $CoF_2$, $YCl_3$, $YF_3$, $RuCl_3$, $RuF_3$, $AlCl_3$, $AlF_3$, $HfCl_4$, $HfF_4$, $ZrCl_4$, $ZrF_4$, $MoCl_5$, $MoF_5$, $SiCl_4$, $SiHCl_3$, $SiH_2Cl_2$, $SiH_3Cl$, $Si_2Cl_6$, or the like can be used as an inorganic-based source gas, other than $TiCl_4$.

An $O_2$ gas, an $O_3$ gas, water vapor ($H_2O$), an $H_2O_2$ gas, an $N_2O$ gas, or the like can be used as an oxygen-containing gas used at the time of the plasma processing.

A gas containing N—H coupling such as an $N_2$ gas, an $N_2O$ gas, an $N_2H_2$ gas, an $N_2H_4$ gas, or an $N_3H_8$ gas can be used as a nitrogen-containing gas used at the time of plasma processing.

A noble gas such as Ar, He, Ne, or Xe may be used as an inert gas, other than the $N_2$ gas.

Further, capacitive coupling plasma (CCP), magnetron discharge plasma, surface wave plasma (SWP), microwave plasma, or the like can be used as the discharging mechanism, other than the inductively coupled plasma (ICP).

The above-described embodiment, modifications, applications, and the like can be appropriately combined and used. Further, processing conditions at that time can be similar to the processing conditions of the above-described embodiment, for example.

What is claimed is:

1. A method of manufacturing a semiconductor device comprising, wherein (a) to (e) are sequentially performed in the following order:
   (a) forming a first mask on a first region of a metal film formed on a surface of a substrate;
   (b) modulating a work function of a first exposed region of the metal film, using plasma of a first process gas;
   (c) removing the first mask;
   (d) forming a second mask on a second region of the metal film; and
   (e) modulating a work function of a second exposed region of the metal film, using plasma of a second process gas,
   wherein, in modulating the work function of the first exposed region, the work function is decreased by removing nitrogen from the first exposed region of the metal film, and
   wherein the act of removing nitrogen comprises oxidizing the first exposed region of the metal film, using plasma of an oxygen-containing gas, and reducing the oxidized first exposed region of the metal film, using plasma of a hydrogen-containing gas.

2. The method of manufacturing a semiconductor device according to claim 1, wherein
   the first region and the second region are different regions from each other.

3. The method of manufacturing a semiconductor device according to claim 1, wherein
   the second region is a region, at least a part of the region being different from the first region.

4. The method of manufacturing a semiconductor device according to claim 1, wherein
   the metal film comprises titanium nitride film.

5. The method of manufacturing a semiconductor device according to claim 1, wherein
   the metal film of the first region is configured as a gate electrode of a P-type MOS, and the metal film of the second region is configured as a gate electrode of an N-type MOS.

6. The method of manufacturing a semiconductor device according to claim 1, wherein (f) to (h) are further sequentially performed in the following order:
- (f) removing the second mask;
- (g) forming a third mask on a third region of the metal film; and
- (h) modulating a work function of a third exposed region of the metal film, using plasma of a third process gas.

7. A method of manufacturing a semiconductor device comprising sequentially performing the following steps:
- (a) providing a processing chamber with a substrate having a metal film formed on a surface, and having a first mask formed on a first region of the surface of the metal film;
- (b) modulating a work function of a first exposed region of the metal film, the first exposed region being exposed to a space in the processing chamber, using plasma of an oxygen-containing gas and plasma of a hydrogen-containing gas;
- (c) providing the processing chamber with the substrate from which the first mask is removed, and having a second mask formed on a second region of the surface of the metal film; and
- (d) modulating a work function of a second exposed region of the metal film, the second exposed region being exposed to the space in the processing chamber, using plasma of a process gas, wherein, in modulating the work function of the first exposed region, the work function is decreased by removing nitrogen from the first exposed region of the metal film, and wherein the act of removing nitrogen comprises oxidizing the first exposed region of the metal film, using plasma of the oxygen-containing gas, and reducing the oxidized first exposed region of the metal film, using plasma of the hydrogen-containing gas.

8. A method of manufacturing a semiconductor device comprising sequentially performing the following steps:
- (a) loading a substrate into a processing chamber, the substrate having a metal film formed on a surface, and having a first mask formed on a first region of the surface of the metal film;
- (b) modulating a work function of a first exposed region of the metal film by exciting an oxygen-containing gas and plasma of a hydrogen-containing gas in the processing chamber into plasma, the first exposed region being exposed to a space in the processing chamber;
- (c) unloading the substrate from the processing chamber;
- (d) loading the substrate into the processing chamber, the substrate from which the first mask is removed, and having a second mask formed on a second region of the surface of the metal film; and
- (e) modulating a work function of a second exposed region of the metal film by exciting a process gas in the processing chamber into plasma, the second exposed region being exposed to the space in the processing chamber, wherein, in modulating the work function of the first exposed region, the work function is decreased by removing nitrogen from the first exposed region of the metal film, and wherein the act of removing nitrogen comprises oxidizing the first exposed region of the metal film, using plasma of the oxygen-containing gas, and reducing the oxidized first exposed region of the metal film, using plasma of the hydrogen-containing gas.

* * * * *